(12) United States Patent
Chobe et al.

(10) Patent No.: US 12,726,001 B2
(45) Date of Patent: Sep. 1, 2026

(54) OPTOELECTRONIC DEVICE COMPRISING A III-V SEMICONDUCTOR MEMBRANE LASER SOURCE FORMING A LATERAL P-I-N JUNCTION

(71) Applicant: COMMISSARIAT A L'ENERGIE ATOMIQUE ET AUX ENERGIES ALTERNATIVES, Paris (FR)

(72) Inventors: Mattéo Chobe, Grenoble Cedex (FR); Karim Hassan, Grenoble Cedex (FR); Cécilia Dupre, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 607 days.

(21) Appl. No.: 18/192,270

(22) Filed: Mar. 29, 2023

(65) Prior Publication Data

US 2023/0318263 A1 Oct. 5, 2023

(30) Foreign Application Priority Data

Mar. 29, 2022 (FR) ...................................... 22 02792

(51) Int. Cl.
*H01S 5/042* (2006.01)
*H01S 5/02* (2006.01)
(Continued)

(52) U.S. Cl.
CPC ............ *H01S 5/0424* (2013.01); *H01S 5/021* (2013.01); *H01S 5/0215* (2013.01);
(Continued)

(58) Field of Classification Search
CPC ...... H01S 5/0424; H01S 5/021; H01S 5/0215; H01S 5/0217; H01S 5/0425;
(Continued)

(56) References Cited

U.S. PATENT DOCUMENTS

2006/0065886 A1* 3/2006 Shi .......................... H01S 5/227
257/13
2019/0131772 A1 5/2019 Caër et al.
(Continued)

FOREIGN PATENT DOCUMENTS

EP 0 562 769 A2 9/1993

OTHER PUBLICATIONS

French Preliminary Search Report and Written Opinion issued Nov. 14, 2022 in French Application 22 02792 filed on Mar. 29, 2022, 10 pages (with English Translation of Categories of Cited Documents).
(Continued)

*Primary Examiner* — Yuanda Zhang
(74) *Attorney, Agent, or Firm* — Oblon, McClelland, Maier & Neustadt, L.L.P.

(57) ABSTRACT

An optoelectronic device, including: a laser source, including a semiconductor membrane, which rests on a first dielectric layer, and which is formed from a lateral segment doped n-type, a lateral segment doped p-type, and an optically active central segment located between and in contact with the doped lateral segments to form a lateral p-i-n junction lying parallel to the main plane. The semiconductor membrane is produced based on crystalline GaAs, the central segment includes GaAs-based quantum dots, and the doped lateral segments are produced based on AlxGa1-xAs with a proportion of aluminium x comprised between 0.05 and 0.30.

11 Claims, 9 Drawing Sheets

(51) Int. Cl.
*H01S 5/183* (2006.01)
*H01S 5/22* (2006.01)
*H01S 5/30* (2006.01)
*H01S 5/323* (2006.01)
*H01S 5/34* (2006.01)

(52) U.S. Cl.
CPC .......... *H01S 5/0217* (2013.01); *H01S 5/0425* (2013.01); *H01S 5/18302* (2013.01); *H01S 5/2222* (2013.01); *H01S 5/305* (2013.01); *H01S 5/323* (2013.01); *H01S 5/3412* (2013.01)

(58) Field of Classification Search
CPC .... H01S 5/18302; H01S 5/2222; H01S 5/305; H01S 5/323; H01S 5/3412
See application file for complete search history.

(56) References Cited

U.S. PATENT DOCUMENTS

| | | | |
|---|---|---|---|
| 2019/0214789 | A1 | 7/2019 | Santis et al. |
| 2019/0252859 | A1 | 8/2019 | Caër et al. |
| 2019/0252860 | A1 | 8/2019 | Caer et al. |

OTHER PUBLICATIONS

Hu et al., "III/V-on-Si MQW lasers by using a novel photonic integration method of regrowth on a bonding template", Light: Science & Applications, vol. 8:93, 2019, DOI: 10.1038/s41377-019-0202-6, 9 pages.
Aihara et al., "Membrane buried-heterostructure DFB laser with an optically coupled III-V/Si waveguide", Optics Express, vol. 27, No. 25, 2019, pp. 36438-36448.
Tager et al., "Ion-Implanted GaAs—InGaAs Lateral Current Injection Laser", IEEE Journal of Selected Topics in Quantum Electronics, vol. 5, No. 3, 1999, 10 pages.
Fujii et al., "Development of an Epitaxial Growth Technique Using III-V on a Si Platform for Heterogeneous Integration of Membrane Photonic Devices on Si", Applied Sciences, 2021, 21 pages.
Norman et al., "Quantum dot lasers-History and future prospects", Journal of Vacuum Science and Technology A 39, 020802 2021; https://doi.org/10.1116/6.0000768, 12 pages.
Chen et al., "Electrically pumped continuous-wave III-V quantum dot lasers on silicon", Nature Photonics, 2016, DOI: 10.1038/NPHOTON.2016.21, pp. 307-312.
Ellis et al., "Ultra-low threshold, electrically pumped quantum dot photonic crystal nanocavity laser", 24 pages.
Liu, "Investigation of electrical and photoluminescent properties of MBE-grown $Al_xGa_{1-x}As$ layers", Journal of Materials Science, 1990, 8 pages.
Saxena, "Electron mobility in $Ga_{1-x}Al_xAs$ alloys", Physical Review B, vol. 24, No. 6, 1981, 8 pages.
Lee et al., "Electron transport and band structure of $Ga_{1-x}Al_xAs$ alloys", Physical Review B, vol. 21, No. 2, Jan. 15, 1980, 11 pages.
Adachi, "Properties of Semiconductor Alloys: Group-IV, III-V and II-VI Semiconductors", Wiley Series in Materials for Electronic & Optoelectric Applications, 2009, 413 pages.

* cited by examiner

OPTOELECTRONIC DEVICE COMPRISING A III-V SEMICONDUCTOR MEMBRANE LASER SOURCE FORMING A LATERAL P-I-N JUNCTION

TECHNICAL FIELD

The invention relates to the field of optoelectronic devices comprising a III-V semiconductor membrane laser source forming a lateral p-i-n junction.

PRIOR ART

Generally, an optoelectronic device such as a photonic chip may comprise a laser source, optically coupled to an integrated photonic circuit. The laser source is produced based on a semiconductor compound, for example a III-V compound such as InP, and the integrated photonic circuit is produced from an SOI carrier substrate (SOI standing for Silicon-On-Insulator). The integrated photonic circuit comprises passive optical components (waveguides, multiplexers, couplers, etc.) and/or active optical components (modulators, photodetectors, etc.), including an integrated waveguide optically coupled to the laser source.

Thus, the laser source comprises a semiconductor block produced based on the III-V compound, which forms a waveguide in which the gain medium is located, this waveguide being called the active waveguide. The laser source is said to be a hybrid laser source when the optical mode in the optical cavity is distributed between the III-V waveguide and the subjacent integrated waveguide. Thus, in the case of a DBR laser (DBR standing for Distributed Bragg Reflector), the optical cavity is bounded by two Bragg gratings located in the integrated waveguide, which gratings form wavelength-selective mirrors. In the case of a DFB laser (DFB standing for Distributed FeedBack), a Bragg grating is located in the integrated waveguide and extends the entire length of the optical cavity.

Document US20190131772A1 discloses an LCI electro-optical device (LCI standing for Lateral Current Injection), which is comprised in or which is implemented as a silicon photonic chip. The device comprises an active region with a stack of III-V semiconductor materials stacked along a stacking direction z. The active region may be formed as a slab having several lateral surface portions, each extending parallel to the stacking direction z. The device further comprises two paired elements, which include a pair of doped layers of III-V semiconductor materials (an n-doped layer and a p-doped layer) and a pair of lateral waveguide cores. The two paired elements may be laterally arranged, two-by-two, on opposite sides of the slab. The elements distinctly adjoin respective portions of the lateral surfaces of the slab, so as for these elements to be separated from each other by the slab.

Document US20190214789A1 discloses the implementation of optical devices comprising integrated quantum wells, and more particularly relates to guiding and confining of electromagnetic modes in low-index materials, namely III-V materials based on silicon nitride (SiN), for applications in optical telecommunication bands.

The article by Yingtao H U et al. in the journal "*Light: Science & Applications*" (2019) Vol. 8, No. 1, 9 Oct. 2019, Official Journal of the CIOMP 2047-7538, entitled "*III-V-on-Si MQW lasers by using a novel photonic integration method of regrowth on a bonding template*" discloses a photonic integration method of epitaxial regrowth of III/V material on a III/V-on-SOI bonding template to realize heterogeneous lasers on silicon, and in particular a multi-quantum well vertical p-i-n diode laser structure.

The article by Aihara et al. entitled *Membrane buried-heterostructure DFB laser with an optically coupled III-V/Si waveguide*, Opt. Express, 27(25), 36438-36448 (2019), describes an example of an optoelectronic device comprising a DFB laser source produced based on InP, which rests on an SOI carrier substrate and which is coupled to a silicon waveguide of an integrated photonic circuit. The semiconductor block takes the form of a membrane, insofar as its thickness, of the order of a few hundred nanometres, is much smaller than its widthwise and lengthwise dimensions. In addition, the semiconductor block (here the semiconductor membrane) is formed from two lateral segments, which are made of InP and doped n-type and p-type, and a central segment that comprises multiple quantum wells and that forms the active region of the laser source (light emission). The lateral segments are arranged on either side of the central segment in a plane parallel to the plane of the carrier substrate, so as to form a lateral p-i-n junction, charge carriers being injected into the central segment laterally and not vertically. Lastly, the quantum wells form a so-called buried heterostructure (BH) insofar as it is located, on the one hand, between two InP layers along the thickness axis, and on the other hand, between the two doped InP lateral segments along the width axis. The InP of the lateral segments has a low refractive index and a wide band gap with respect to the central segment, this ensuring optical confinement of the guided mode and confinement of the charge carriers in the central segment, and decreasing the absorption of electrons in the lateral InP segment doped p-type. Lastly, the semiconductor membrane is encircled by a silicon oxide that participates in the optical confinement of the guided mode.

There is however a need to improve the performance of such an optoelectronic device.

SUMMARY OF THE INVENTION

One aim of the invention is to at least partially remedy the drawbacks of the prior art, and more particularly to improve the performance of an optoelectronic device comprising a III-V semiconductor membrane laser source forming a lateral p-i-n junction.

To this end, one object of the invention is an optoelectronic device comprising a carrier substrate containing a first dielectric layer, which layer is made of an electrically insulating material, and forms a top side of the carrier substrate lying in a main plane. The optoelectronic device also comprises a laser source comprising: a semiconductor membrane, which rests on the first dielectric layer, and which is formed from a lateral segment doped n-type, a lateral segment doped p-type, and an optically active central segment located between and in contact with the doped lateral segments to form a lateral p-i-n junction lying parallel to the main plane; a second dielectric layer, which is made of an electrically insulating material, and which covers the semiconductor membrane; and electrodes, which rest on the doped lateral segments, and which thus ensure lateral injection of charge carriers into the central segment.

According to the invention, the semiconductor membrane is produced based on crystalline GaAs, the central segment comprises GaAs-based quantum dots, and the doped lateral segments are produced based on $Al_xGa_{1-x}As$ with a proportion of aluminium x comprised between 0.05 and 0.30.

Some preferred but non-limiting aspects of this optoelectronic device are as follows.

The proportion of aluminium x may be comprised between 0.10 and 0.25.

The electrodes may make contact with the doped lateral segments.

The optoelectronic device may comprise an intermediate layer, which is produced based on crystalline $Al_yGaAs$ with a proportion of aluminium y higher than the proportion of aluminium x of the doped lateral segments, and which lies between and makes contact with the first dielectric layer on the one hand and the semiconductor membrane on the other hand.

The first and second dielectric layers may be made of a material having a refractive index lower than that of the central segment.

The carrier substrate may be an SOI substrate.

The carrier substrate may comprise an integrated waveguide optically coupled to an active waveguide formed by the central segment of the semiconductor membrane.

The invention also relates to a process for fabricating the optoelectronic device according to any one of the preceding features. It comprises the following steps:

- a) producing a semiconductor stack, comprising: a growth substrate, an etch-stop layer grown epitaxially from the growth substrate, and an intermediate layer based on epitaxially grown AlGaAs;
- b) transferring and joining the semiconductor stack to the carrier substrate, the intermediate layer being oriented toward the carrier substrate;
- c) removing the growth substrate then the etch-stop layer;
- d) producing the semiconductor membrane, from at least the intermediate layer;
- e) producing the second dielectric layer and the electrodes.

According to one variant, in step a), the semiconductor stack may comprise a quantum-dot layer, which is intended to form the central segment, which is grown epitaxially from the etch-stop layer, and from which the intermediate layer is grown epitaxially. Following step c), one side of the quantum-dot layer may be freed. Step d) may comprise operations of: structuring the quantum-dot layer to free a surface of the intermediate layer and to obtain the central segment; and producing the doped lateral segments by epitaxy from the intermediate layer.

According to another variant, in step a), the semiconductor stack may comprise the intermediate layer grown epitaxially from the etch-stop layer. Following step c), one side of the intermediate layer may be freed. Step d) may comprise operations of: producing a quantum-dot layer by epitaxy from the intermediate layer; structuring the quantum-dot layer to free a surface of the intermediate layer and to obtain the central segment; and producing the doped lateral segments by epitaxy from the intermediate layer.

According to another variant, the process may comprise the following steps:

- a) producing a semiconductor stack, comprising: a growth substrate, an etch-stop layer grown epitaxially from the growth substrate, and a lateral structure grown epitaxially from the etch-stop layer and formed from the central segment and from doped lateral layers that are produced based on $Al_xGa_{1-x}As$ and that are located on either side of the central segment in the main plane;
- b) transferring and joining the semiconductor stack to the carrier substrate, the intermediate layer being oriented toward the carrier substrate;
- c) removing the growth substrate then the etch-stop layer, freeing a side of the lateral structure opposite the carrier substrate;
- d) producing the semiconductor membrane, by structuring the doped lateral layers to obtain the doped lateral segments;
- e) producing the second dielectric layer and the electrodes.

BRIEF DESCRIPTION OF THE DRAWINGS

Other aspects, aims, advantages and features of the invention will become more clearly apparent on reading the following detailed description of preferred embodiments thereof, this description being given by way of non-limiting example and with reference to the appended drawings, in which.

DETAILED DESCRIPTION OF PARTICULAR EMBODIMENTS

In the figures and in the remainder of the description, the same references have been used to designate identical or similar elements. In addition, the various elements have not been shown to scale for the sake of clarity of the figures. Moreover, the various embodiments and variants are not mutually exclusive and may be combined with one another. Unless indicated otherwise, the terms "substantially", "about" and "of the order of" mean to within 10%, and preferably to within 5%. Moreover, the terms "comprised between . . . and . . . " and equivalents mean inclusive of limits, unless indicated otherwise.

Figure 1A:
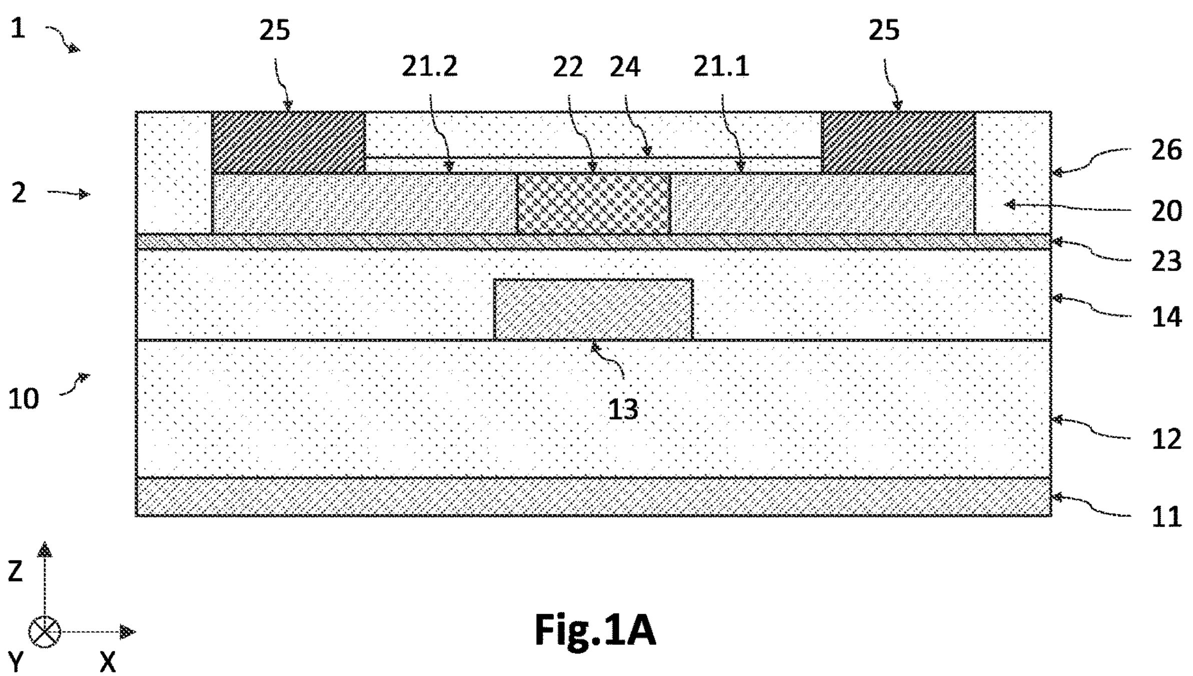
FIGS. 1A and 1B are schematic and partial views, in cross section (FIG. 1A) and seen from above (FIG. 11B), of an optoelectronic device comprising a semiconductor membrane laser source, according to one embodiment.
Figure 1B:
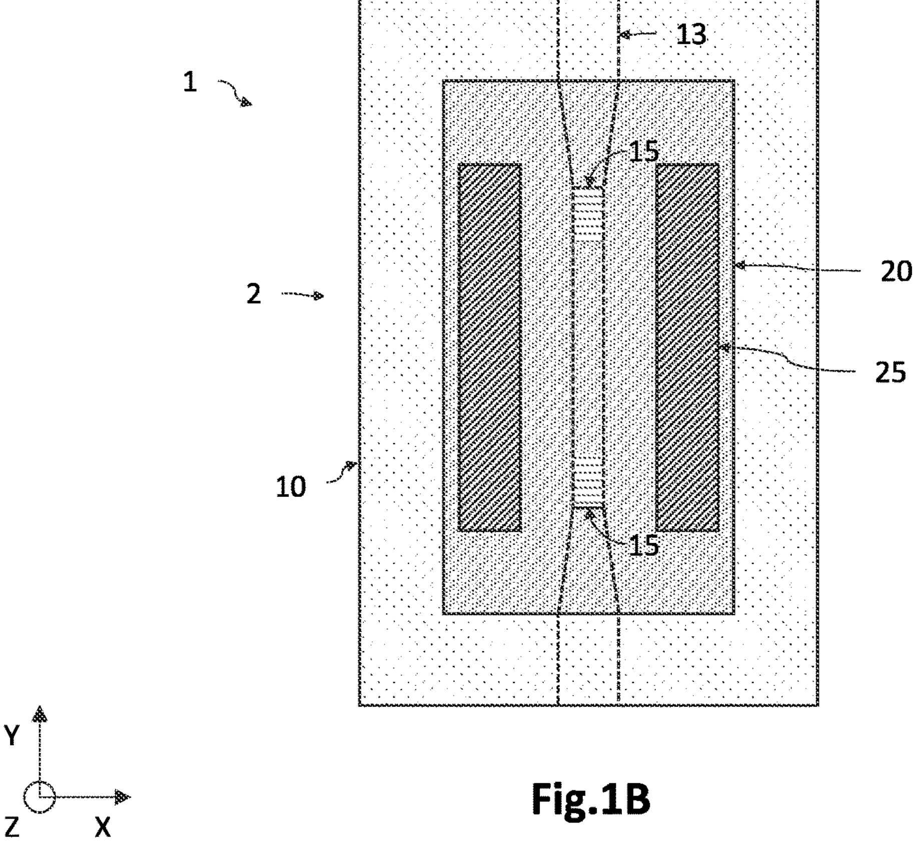

FIGS. 1A and 1B are schematic and partial views, in cross section (FIG. 1A) and seen from above (FIG. 11B), of an optoelectronic device 1 according to one embodiment.

Generally, the optoelectronic device 1 comprises a carrier substrate 10, which may be a photonic substrate, on which rests a semiconductor membrane laser source 2, the semiconductor membrane of which has been referenced 20. As indicated above, the semiconductor membrane 20 is a block produced based on a crystalline Ill-V semiconductor compound, the thickness of which is smaller than its width and than its length. It comprises an optically active central segment 22, which is located between and in contact with two doped lateral segments 21.1, 21.2, these segments 21.1, 21.2, 22 together forming a lateral p-i-n junction that lies parallel to a main plane. The (active) central segment 22 forms the active waveguide of the laser source 2.

An orthogonal three-dimensional direct coordinate system XYZ, in which the X- and Y-axes form a plane parallel to a main plane of the carrier substrate 10, in which plane the latter lies, said X- and Y-axes being oriented along the width and length of the semiconductor membrane 20, respectively, and said Z-axis being oriented along the thickness of the semiconductor membrane 20 and away from the carrier substrate 10, is defined here and will be referred to in the rest of the description.

The carrier substrate 10 is here an SOI substrate, and comprises in this example: a silicon substrate 11 having a thickness of the order of several hundred microns; a BOX or buried-oxide layer 12 (BOX standing for Buried OXide) that covers the silicon substrate 11; an integrated waveguide 13, which here is made of single-crystal silicon; and a dielectric encapsulation layer 14 covering the integrated waveguide 13 and the buried-oxide layer 12. The dielectric encapsulation layer 14 is made of at least one electrically insulating material, which also has a refractive index lower than that of silicon, on the one hand, and also lower than that of the material forming the active waveguide (central segment 22) located in the semiconductor membrane 20, on the other hand. It is here a question of silicon oxide. The dielectric encapsulation layer 14 defines the top side of the carrier substrate 10.

In this example, the carrier substrate 10 is a photonic substrate, in the sense that it comprises an integrated photonic circuit (IPC) of which the integrated waveguide 13 forms part. It may therefore also comprise active optical components and/or passive optical components, as mentioned above. As a variant, the carrier substrate 10 may not be a photonic substrate, in the sense that it may not comprise any integrated photonic circuit. Thus, the active waveguide of the semiconductor membrane 20 is then not coupled to an integrated waveguide 13.

The laser source 2 rests on the carrier substrate 10. It comprises the semiconductor membrane 20, which is produced based on a crystalline Ill-V semiconductor compound, and more precisely based on GaAs. In other words, the semiconductor membrane 20 mainly comprises GaAs or mainly comprises one or more ternary compounds, quaternary compounds, etc., based on GaAs.

The semiconductor membrane 20 is a block that is qualified a membrane insofar as its thickness along the Z-axis is smaller than its width along the X-axis, and its length along the Y-axis. Its thickness may be of the order of a few hundred nanometres. In this example, in which the active waveguide is coupled to the integrated waveguide 13, the thickness of the semiconductor membrane 20 is chosen so as to optimize optical coupling between the two waveguides. By way of example, its thickness may be comprised between 200 nm and 400 nm, and may for example be equal to about 300 nm. Moreover, its width may be of the order of 6 μm and its length of the order of 100 μm.

It will also be noted that its thickness is smaller than the critical thickness above which the mechanical stresses generated during production of the semiconductor membrane 20 by epitaxy relax plastically. Thus, the semiconductor membrane 20 contains no or few structural defects such as dislocations due to lattice mismatch, and therefore has a high crystal quality. Thus, the lateral segments 21.1, 21.2 may be produced based on single-crystal $Al_xGa_{1-x}As$.

The semiconductor membrane 20 therefore comprises a lateral segment 21.1 doped n-type, a lateral segment 21.2 doped p-type, and a central segment 22, called the active segment, located between and in contact with the two lateral segments 21.1, 21.2. These lateral segments 21.1, 21.2 and central segment 22 are arranged parallel to the main XY-plane, and thus form a lateral p-i-n junction, and not a vertical p-i-n junction.

The lateral segments 21.1, 21.2 are produced based on crystalline $Al_xGa_{1-x}As$, and here are made of $Al_xGa_{1-x}As$, where x is the proportion of aluminium. They are preferably made of the same III-V semiconductor compound, particularly in terms of proportion of aluminium x. The lateral segment 21.1 doped n-type may have a doping level comprised between about $5\times10^{17}$ and $5\times10^{18}$ $cm^{-3}$, and the lateral segment 21.1 doped p-type may have a doping level comprised between about $5\times10^{18}$ and $5\times10^{19}$ $cm^{-3}$.

As detailed below, the proportion of aluminium x of the doped lateral segments 21.1, 21.2 is comprised between about 0.05 and 0.30, and preferably between about 0.10 and 0.25, this making it possible to optimize both the optical confinement of the guided mode in the active waveguide, and the confinement of charge carriers in the central segment 22. Indeed, the $Al_xGa_{1-x}As$ compound has a refractive index lower than that of the central segment 22, and a band gap wider than that of the central segment 22. In addition, the $Al_xGa_{1-x}As$ compound may have a low diffusion voltage $\Delta V_d$, in order thus to limit the risk of leakage of electrons from the central segment 22 to the p-doped lateral segment.

The central segment 22 comprises quantum dots, and not a stack of multiple quantum wells. Quantum dots are semiconductor nanocrystals the quantum confinement of which is three-dimensional. They may here be of InAs/GaAs type, i.e. they are InAs nanocrystals located in a GaAs wetting layer. There may thus be therein a stack of a plurality of GaAs wetting layers, each comprising a plurality of InAs nanocrystals. The average size of the quantum dots may be comprised between 0.2 nm and 50 nm, and for example between 1 nm and 30 nm. Moreover, the central segment 22 is made of an intrinsic material, in the sense that it is not intentionally doped.

The laser source 2 comprises an intermediate layer 23, on which the semiconductor membrane 20 rests and with which the semiconductor membrane 20 makes contact. The intermediate layer 23 extends over the carrier substrate 10, and may cover the top side thereof. The intermediate layer 23 is produced based on $Al_yGa_{1-y}As$, and is here made of $Al_yGa_{1-y}As$. The proportion of aluminium y is preferably higher than the proportion of aluminium x of the doped lateral segments 21.1, 21.2. This intermediate layer 23 may be present in order to allow the doped lateral segments 21.1, 21.2 to be grown by epitaxy during the process for fabricating the optoelectronic device 1 (according to the embodiments of FIGS. 3A-3H and 5A-5F). Moreover, since the proportion of aluminium y is advantageously higher than x, the intermediate layer has a band gap wider than that of the doped lateral segments 21.1, 21.2, thus limiting leakage of charge carriers. Since the proportion of aluminium x is comprised between about 0.05 and 0.30, and preferably between about 0.10 and 0.25, the proportion of aluminium y may be equal to about 0.35 or 0.40.

The laser source 2 comprises electrodes 25, which are intended to apply an electrical bias to the lateral p-i-n junction of the semiconductor membrane 20. These electrodes 25 are made of an electrically conductive material, a metal for example, and preferably rest on and make contact with the doped lateral segments 21.1, 21.2. Specifically, insofar as the doped lateral segments 21.1, 21.2 are produced based on AlGaAs, a high-performance ohmic contact is thus obtained. It will be noted that each lateral segment 21.1, 21.2 may have, locally, on its top side, a doping level higher than the subjacent doping level (or than the average doping level in the lateral segment), so as to further improve the quality of the electrical contact with the electrode 25.

The laser source 2 may comprise a dielectric layer 24 that is located on and in contact with the semiconductor membrane 20, and that extends between the electrodes in the XY-plane. The dielectric layer 24 more precisely lies on and in contact with the central segment 22 and on portions of the doped lateral segments 21.1, 21.2. This dielectric layer 24 is made of an electrically insulating material, for example of a nitride such as a silicon nitride and/or an oxide. It forms a growth mask that is used in the process for fabricating the optoelectronic device 1, and more precisely in the steps of production of the doped lateral segments 21.1, 21.2 by epitaxial growth, to thus prevent growth of the $Al_xGa_{1-x}As$ compound from the semiconductor membrane 20 in the process of being obtained.

The laser source 2 comprises a dielectric encapsulation layer 26, which covers the semiconductor membrane 20 and the carrier substrate 10. This dielectric layer 26 is made of an electrically insulating material, and has a refractive index lower than that of the semiconductor membrane 20, in order thus to promote optical confinement of the guided mode in the active waveguide. This material may be an oxide, for example a silicon oxide such as $SiO_2$.

Lastly, the laser source 2 is here a hybrid DBR source in the sense that the reflectors bounding the optical cavity are Bragg gratings 15 that are produced in the integrated waveguide 13 and that are distant from each other along the lengthwise Y-axis. It is of course possible for the source to be a DFB laser, in which a Bragg grating is located in the integrated waveguide 13 and extends the entire length of the optical cavity. As a variant, the laser source 2 may not be a hybrid source, the reflectors then being located not in the integrated waveguide 13 but in the semiconductor membrane 20, and for example on the top side of the central segment 22 or on the top side of the dielectric layer.

Thus, the performance of the optoelectronic device 1 is improved with respect to the performance of the aforementioned prior-art example, because the semiconductor membrane 20 is produced based on GaAs, because it contains GaAs-based quantum dots (here InAs/GaAs quantum dots), and because the doped lateral segments 21.1, 21.2 are produced based on $Al_xGa_{1-x}As$ with a proportion of aluminium x comprised between about 0.05 and 0.30, and preferably comprised between about 0.10 and 0.25. Specifically, the optoelectronic device 1 not only provides good optical confinement of the guided mode in the active waveguide, it also has good electrical properties, both in terms of electrical resistance in the lateral segments (lateral injection of charge carriers) and in terms of leakage of charge carriers out of the central segment 22. In addition, it is then possible to obtain a central segment 22 that contains quantum dots, and not multiple quantum wells, this notably making it possible to obtain a higher operating temperature, a decrease in threshold current, and a lower sensitivity to crystal defects, among other advantages of quantum dots.

Figure 2A:
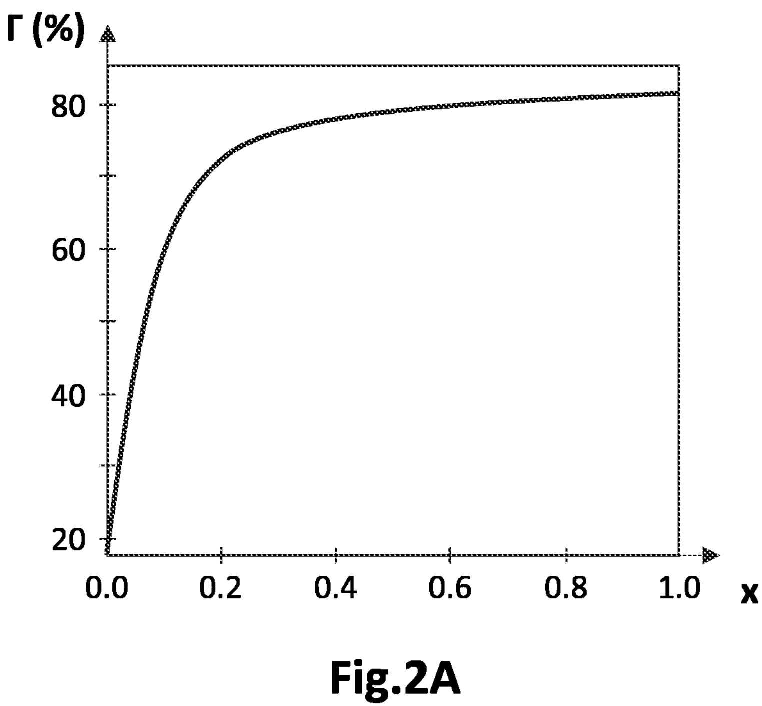
FIG. 2A illustrates one example of variation in the optical confinement factor of the (active) central segment of the semiconductor membrane as a function of the proportion of aluminium x in the doped lateral segments made of $Al_xGa_{1-x}As$.

In this respect, FIG. 2A illustrates one example of variation in the optical confinement factor F of the guided mode in the active waveguide (central segment 22), as a function of the proportion of aluminium x in the lateral segments made of $Al_xGa_{1-x}As$.

In this example, the optoelectronic device 1 comprised a semiconductor membrane 20 of 300 nm thickness comprising lateral segments made of $Al_xGa_{1-x}As$ and a central segment 22 made of intrinsic GaAs of 1 μm width, which was encapsulated in a dielectric layer made of $SiO_2$. The integrated waveguide 13 was not present. The optical confinement factor Γ was determined using the MODE—FDE solver of the Lumerical software package to numerically simulate the equations of electromagnetism.

As the curve shows, the optical confinement factor Γ increases very rapidly between x=0 and 0.10, then increases slowly from x=0.30. It is thus at a value of about 50% for x=0.05, and at a value of about 60% for x=0.10, but for x=0.30 is 75%. Thus, a proportion of aluminium of at least about 0.05, and preferably of at least about 0.10, allows a good optical confinement of the guided mode in the central segment 22 to be obtained.

Moreover, the mobility of the electrons in the lateral segments 21.1, 21.2 of doped $Al_xGa_{1-x}As$, which is representative of the electrical resistance in these lateral segments 21.1, 21.2, drops sharply as the proportion of aluminium x increases. Thus, it is maximum for a proportion x of zero, and lower by almost two orders of magnitude when the proportion x is of the order of 0.40 to 0.50. Thus, with a proportion of aluminium x of at most about 0.30, and preferably of at most about 0.25, electron mobility, and therefore electrical resistance, remains high enough for the laser source 2 to exhibit good electrical properties.

Figure 2B:
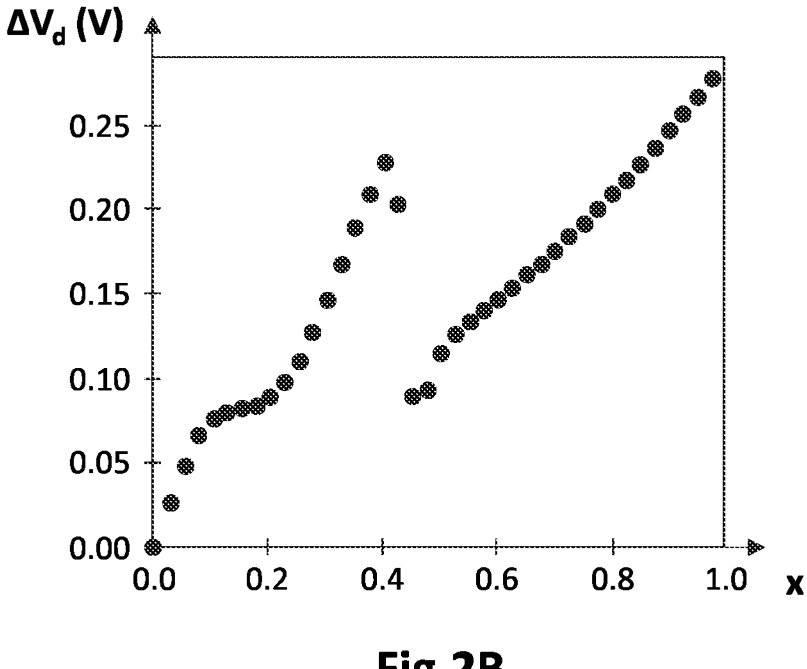
FIG. 2B illustrates one example of variation in the diffusion voltage at the interface between the (active) central segment of the semiconductor membrane and the lateral segments made of doped $Al_xGa_{1-x}As$, as a function of the proportion of aluminium x.

Lastly, FIG. 2B illustrates one example of variation in the diffusion voltage $\Delta V_d$ associated with the potential barriers at the interface between the central segment 22 and the doped lateral segments 21.1, 21.2, as a function of the proportion of aluminium x of the lateral segments made of $Al_xGa_{1-x}As$.

The configuration of the optoelectronic device 1 was here similar to that of FIG. 2A. The diffusion voltage $\Delta V_d$ was determined using the simulation software package SILVACO® from ATLAS®. The curve shows that the diffusion voltage $\Delta V_d$ increases up to x=0.40 before decreasing sharply. Specifically, from about 0.40, the band structure of the $Al_xGa_{1-x}As$ changes from a direct structure to an indirect structure. It is however important for the proportion of aluminium to remain low, here lower than about 0.30, for the diffusion voltage to also be low. Thus, it is not necessary to apply a large potential difference to the doped lateral segments of the laser source, this allowing the risk of leakage of electrons from the central segment 22 to the p-doped lateral segment to be limited.

Thus, because the lateral segments are produced based on $Al_xGa_{1-x}As$ with a proportion of aluminium comprised between about 0.05 and 0.30, and preferably between about 0.10 and 0.25, the optoelectronic device 1 has an optimized performance in terms of optical properties (optical confinement in the central segment 22) and of electrical properties (confinement and decrease of leakage of charge carriers).

FIGS. 3A to 3H illustrate steps of a process for fabricating an optoelectronic device 1 similar to that of FIGS. 1A and 1B, according to a first embodiment.

Figure 3A:
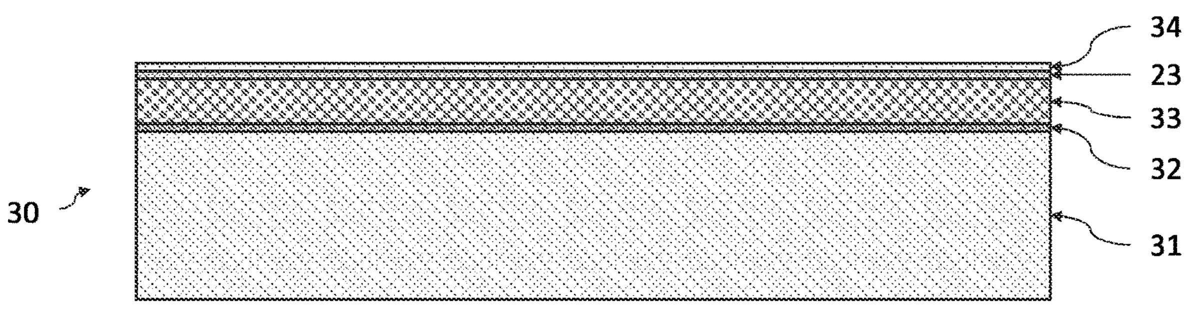
FIGS. 3A to 3H illustrate steps of a process for fabricating an optoelectronic device, according to one embodiment, in which the quantum-dot layer is produced before transfer and joining to the photonic carrier substrate.

With reference to FIG. 3A, a semiconductor stack 30 is first produced, this stack comprising, along a vertical axis: a GaAs-based growth substrate 31, which is here for example made of GaAs; an etch-stop layer 32; a quantum-dot layer 33, the quantum dots of which are here of InAs/GaAs type; and lastly the $Al_yGa_{1-y}As$-based intermediate layer 23. The semiconductor stack 30 may also be covered with a bonding layer 34, which here is based on an oxide such as $SiO_2$.

The growth substrate 31 is here made of crystalline GaAs, and preferably of single-crystal GaAs. It may be made of another crystalline material, which will have a lattice parameter suitable for epitaxial growth of the etch-stop layer 32 and then of the quantum-dot layer 33.

The etch-stop layer 32 is produced by epitaxy of a crystalline semiconductor from the growth substrate 31. It may here be made of $In_{0.49}Ga_{0.51}P$, the lattice parameter of which is a good match to that of the GaAs of the growth substrate 31. It may have a thickness of the order of 200 nm.

The quantum-dot layer 33 is produced by epitaxy from the etch-stop layer 32, so as to form quantum dots of InAs/GaAs type or equivalents. It is therefore a question of InAs nanocrystals located in wetting layers made of GaAs. The quantum-dot layer 33 may be produced using the Stranski-Krastanov growth method. It consists in depositing a material (here InAs) having a lattice mismatch with GaAs. Growth is first two-dimensional (pseudomorphic InAs layer) until a critical thickness is reached, relaxation of mechanical stresses then leading to the formation of the quantum dots. This method, which is well known, will not be described in more detail. The quantum-dot layer 33 has the thickness desired for the semiconductor membrane 20, for example a thickness of the order of a few hundred nanometres. There may be a number of superposed planes of quantum dots.

The bonding layer 34, which here is made of $SiO_2$, may be thinned by chemical-mechanical polishing (CMP) so as to give it a thickness of the order of a few tens of nanometres, 50 nm for example, and an RMS roughness suitable for bonding with the carrier substrate 10. It will moreover be noted that this bonding layer 34 remains optional, insofar as it is also conceivable to form a joint via 'III-V to oxide' bonding.

Figure 3B:
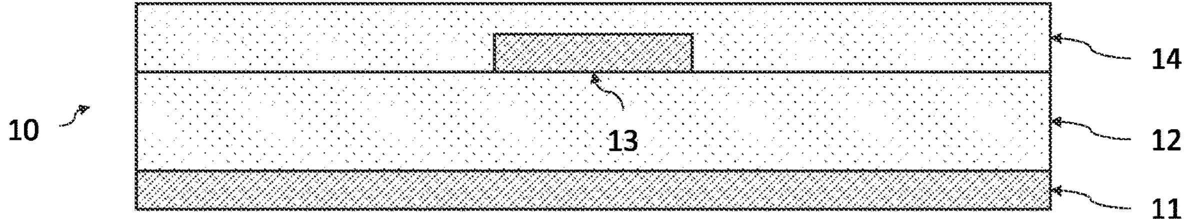

With reference to FIG. 3B, the carrier substrate 10, which here is a photonic SOI substrate, is produced. As indicated above, it comprises: a silicon substrate 11; a buried-oxide layer 12 (BOX); an integrated waveguide 13 made of single-crystal silicon and belonging to an integrated photonic circuit (IPC); and lastly a dielectric encapsulation layer 14, here made of a silicon oxide, which covers the integrated waveguide 13 and the buried-oxide layer 12.

Figure 3C:
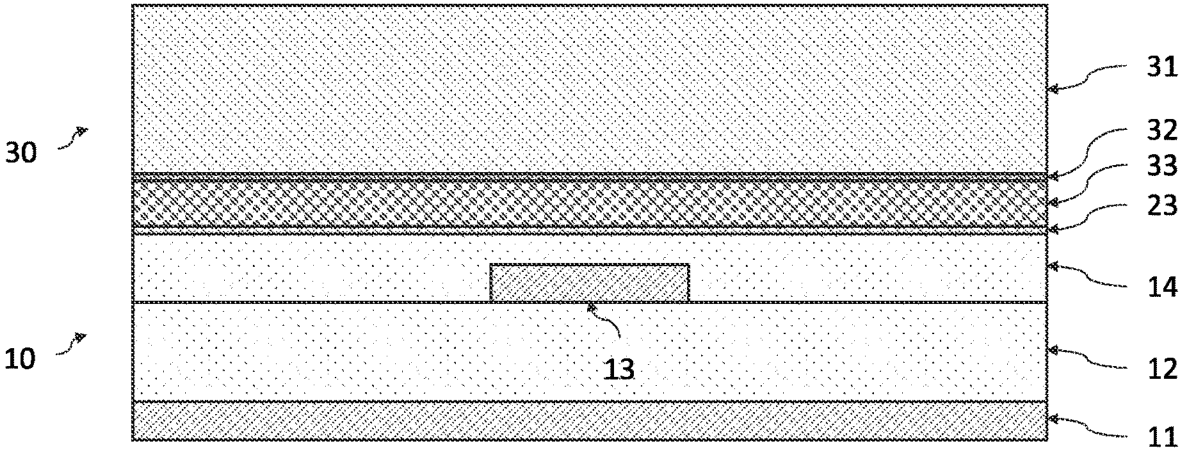

With reference to FIG. 3C, the semiconductor stack 30 is transferred and joined to the carrier substrate 10 by bonding, such that the bonding layer 34 makes contact with the dielectric encapsulation layer 14. In this example, the joint is formed by oxide-oxide direct bonding.

Figure 3D:
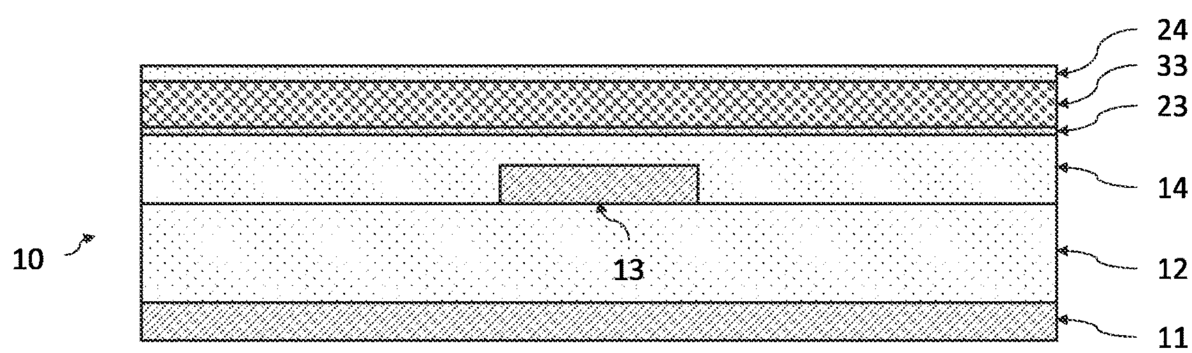

With reference to FIG. 3D, the growth substrate 31 is removed, for example by grinding followed by a chemical etch of the GaAs that is selective to the material of the InGaP etch-stop layer 32. The etch-stop layer 32 is then removed, for example using a chemical etch that is selective to the material of the quantum-dot layer 33. Lastly, a dielectric layer 24 is deposited so as to cover the quantum-dot layer 33, this dielectric layer 24 forming a hard mask that will be used to produce the doped lateral segments 21.1, 21.2. It may be made of at least one electrically insulating material, such as an oxide or a nitride of silicon, or even be a bilayer formed from a thin nitride layer and from a thin oxide layer. In this example, the dielectric layer 24 is made of a silicon nitride.

Figure 3E:
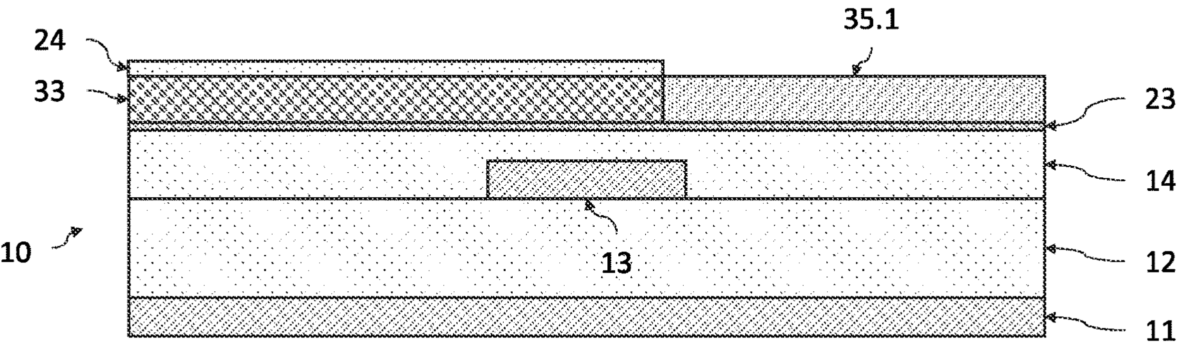

With reference to FIG. 3E, a doped lateral layer 35.1, here for example the lateral layer doped n-type, is produced. It is here made of $Al_xGa_{1-x}As$, and is intended to form the lateral segment 21.1 doped n-type. To do this, one portion of the dielectric layer 24 is removed, then the entire thickness of the freed portion of the quantum-dot layer 33 is removed by photolithography and localized etching. The etch may be a plasma etch selective to the intermediate $Al_yGa_{1-y}As$ layer 23. Epitaxial regrowth is then performed to form a lateral layer 35.1, here made of $Al_xGa_{1-x}As$ doped n-type, which makes lateral contact with the quantum-dot layer 33. The doping is here achieved during growth, but doping by ion implantation or by diffusion is also possible. As indicated above, the n-type doping level may be of the order of $5\times10^{17}$ to $5\times10^{18}$ $cm^{-3}$.

Figure 3F:
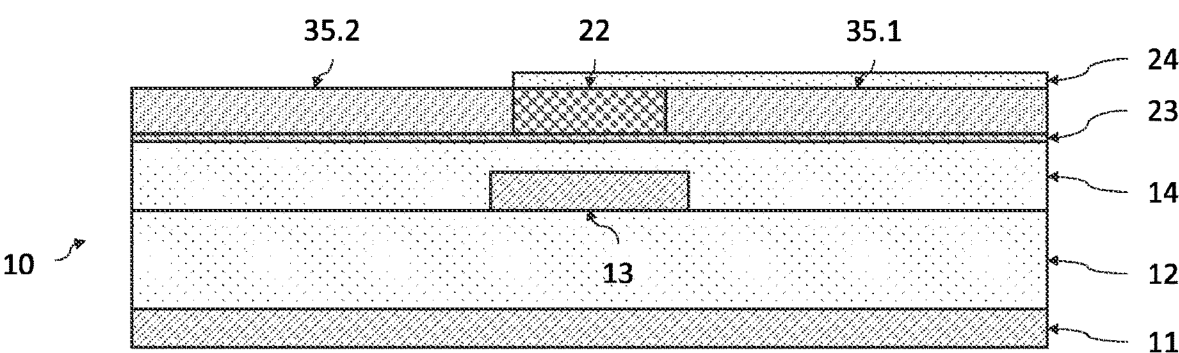

With reference to FIG. 3F, the lateral layer 35.2 doped p-type, which here is made of $Al_xGa_{1-x}As$, and which is intended to form the lateral segment 21.2 doped p-type, is then produced. To do this, one portion of the dielectric layer 24 is removed, then the entire thickness of the freed portion of the quantum-dot layer 33 is removed by photolithography and localized etching. The remaining portion of the quantum-dot layer 33 then forms the (active) central segment 22. Epitaxial regrowth is then performed to form a lateral layer 35.2, here made of $Al_xGa_{1-x}As$ doped p-type, which makes lateral contact with the central segment 22. The p-type doping level may be of the order of $5\times10^{18}$ to $5\times10^{19}$ $cm^{-3}$.

Figure 3G:
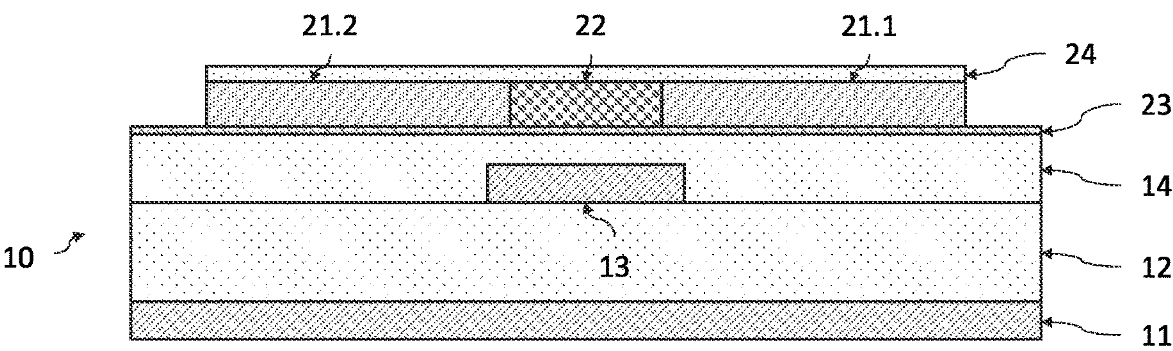

With reference to FIG. 3G, the doped lateral segments 21.1, 21.2 are then produced, by photolithography and localized etching of the dielectric layer 24 then of one portion of the doped lateral layers 35.1, 35.2 right through their thickness. The etch may be selective to the intermediate layer 23 as here, or may be stopped on the oxide of the dielectric encapsulation layer 14. The semiconductor membrane 20 formed from the central segment 22 located between and in contact with the doped lateral segments 21.1, 21.2, thus forming a lateral p-i-n junction, is thus obtained. The semiconductor membrane 20 is here coated with the dielectric layer 24.

Figure 3H:
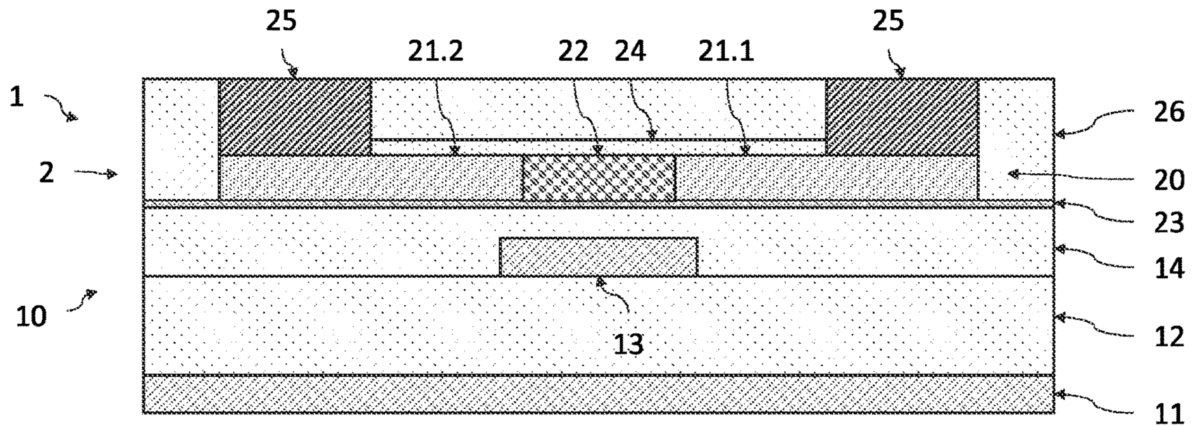

With reference to FIG. 3H, the dielectric encapsulation layer 26, which is for example made of an oxide such as $SiO_2$, is then deposited so as to cover the semiconductor membrane 20 and the carrier substrate 10. Electrodes 25 are then produced through the dielectric encapsulation layer 26, which electrodes here make contact with the doped lateral segments 21.1, 21.2.

An optoelectronic device 1 that comprises a semiconductor membrane 20 laser source 2 buried in a dielectric material (layers 14 and 26), and that has an improved optical and electrical performance, is thus obtained.

FIGS. 4A to 4F illustrate steps of a process for fabricating an optoelectronic device 1 similar to that of FIGS. 1A and 1B, according to a second embodiment. Here, the central segment 22 and the lateral layers 35.1, 35.2 are produced in the semiconductor stack 30, and not on the carrier substrate 10. This notably makes it possible to prevent the temperature increase required to produce the lateral layers 35.1, 35.2 by epitaxy from degrading the quality of the direct bond. It will be noted that, in this embodiment, the intermediate layer 23 based on $Al_yGa_{1-y}As$ is optional, insofar as the lateral layers 35.1, 35.2 are not grown epitaxially from this intermediate layer 23, but instead are grown from the etch-stop layer before the step of transfer and bonding.

Figure 4A:
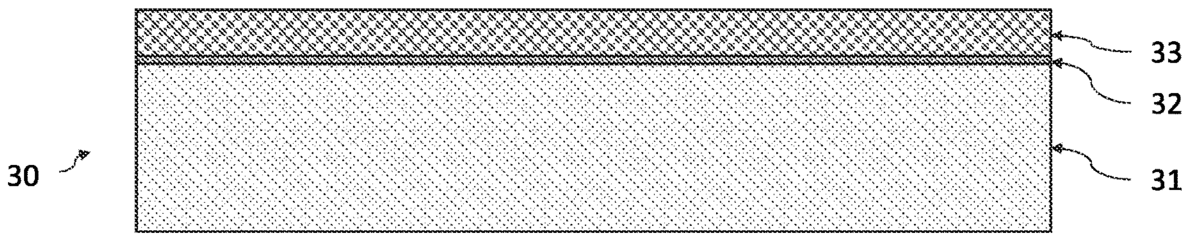
FIGS. 4A to 4F illustrate steps of a process for fabricating an optoelectronic device, according to another embodiment, in which the (active) central segment and the doped lateral layers are produced before transfer and joining to the photonic carrier substrate.

With reference to FIG. 4A, a semiconductor stack 30 is first produced, this stack comprising the growth substrate 31, which is here made of GaAs, the etch-stop layer 32, which is here made of InGaP, and the quantum-dot layer 33.

Figure 4B:
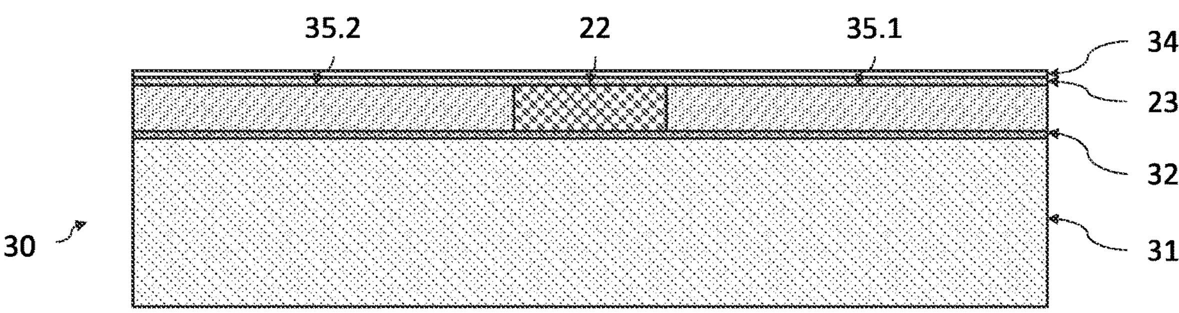

With reference to FIG. 4B, the central segment 22 and the lateral layers 35.1, 35.2 are then produced by photolithography and localized etching of the quantum-dot layer 33 right through its thickness, then epitaxial regrowth from the etch-stop layer 32. The lateral layers 35.1, 35.2 are preferably doped during growth. This step is performed in a similar way to the steps of FIG. 3D to 3F described above. Next the intermediate layer 23 made of $Al_yGa_{1-y}As$ is produced by epitaxy from the central segment 22 and lateral layers, then the $SiO_2$ bonding layer 34 is deposited. As indicated above, the intermediate layer 23 is optional but advantageous.

Figure 4C:
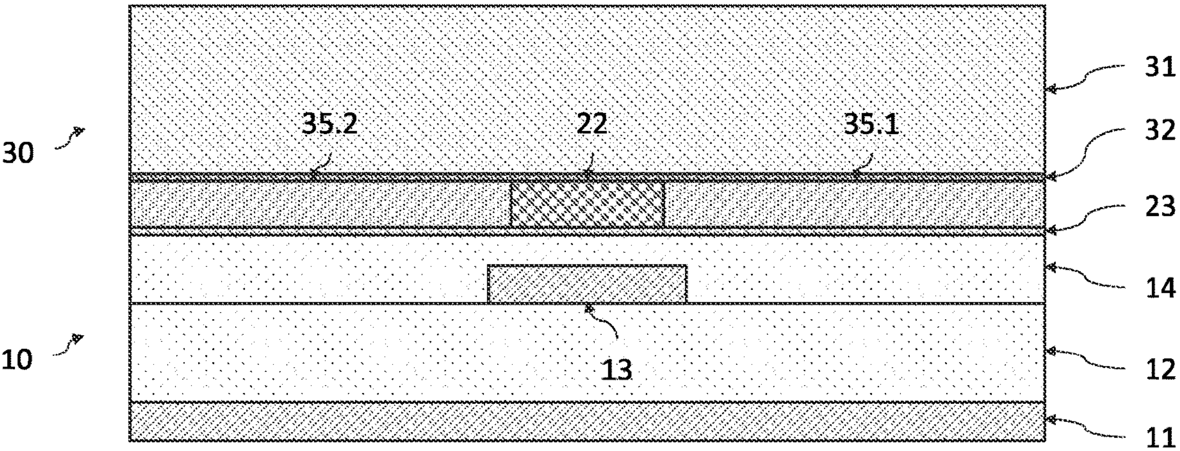

With reference to FIG. 4C, the semiconductor stack 30 is transferred and joined to the carrier substrate 10 by bonding, such that the bonding layer 34 makes contact with the dielectric encapsulation layer 14. In this example, the joint is formed by oxide-oxide direct bonding, but, as indicated above, Ill-V/$SiO_2$ bonding is possible.

Figure 4D:
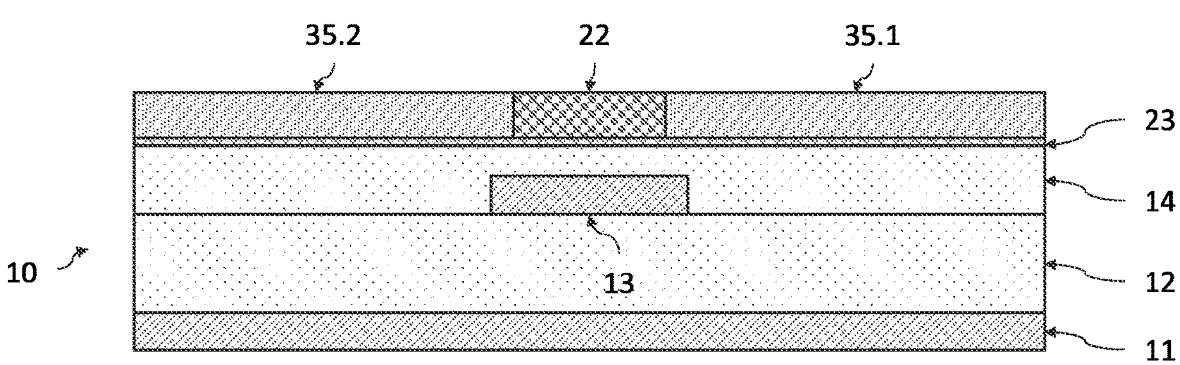

With reference to FIG. 4D, the growth substrate 31 is removed then the etch-stop layer 32 is removed. This step is performed as above and is not described in detail again. Following this step, the top side of the central segment 22 and the top side of the doped lateral layers 35.1, 35.2 are freed.

Figure 4E:
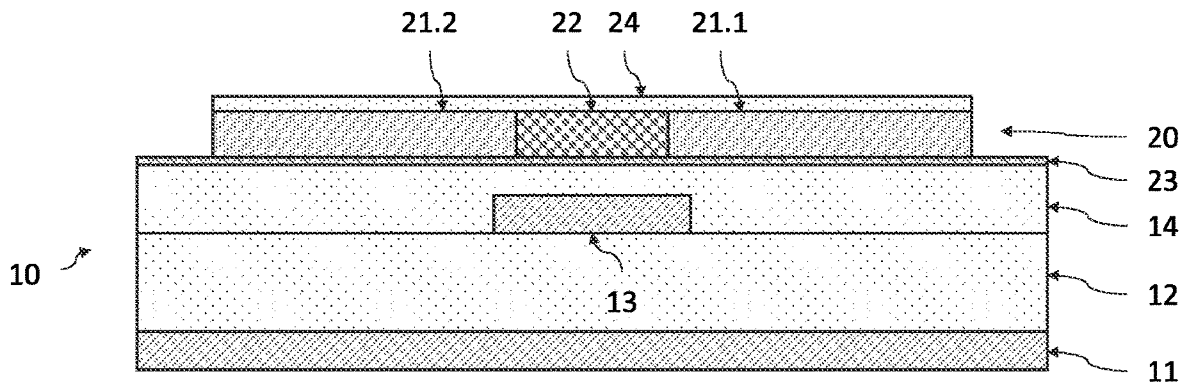

With reference to FIG. 4E, the semiconductor membrane 20 is produced. To do this, as described above, the dielectric layer 24 (hard mask) is deposited on the central segment 22 and the doped lateral layers 35.1, 35.2, and the doped lateral segments 21.1, 21.2 are produced by photolithography and localized etching of the doped lateral layers 35.1, 35.2.

Figure 4F:
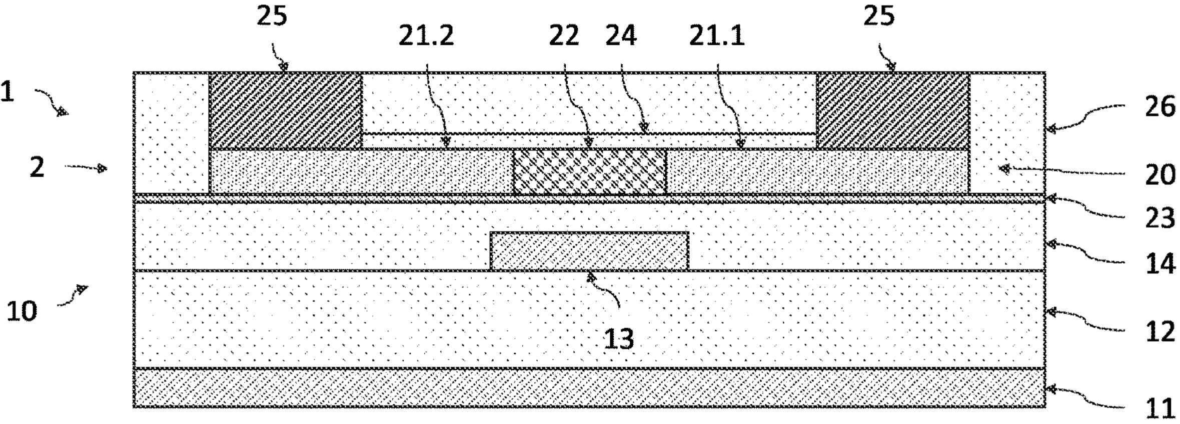

With reference to FIG. 4F, fabrication of the optoelectronic device 1 is finished via production of the dielectric encapsulation layer 26 covering the semiconductor membrane 20 and the carrier substrate 10, followed by production of the electrodes 25.

FIGS. 5A to 5F illustrate steps of a process for fabricating an optoelectronic device 1 similar to that of FIGS. 1A and 1B, according to a third embodiment. Here, the quantum-dot layer 33 is not produced in the semiconductor stack 30, but on the carrier substrate 10. This makes it possible, in contrast to the embodiment of FIGS. 4A to 4F, to take advantage of the increase in temperature during production by epitaxy of the quantum-dot layer 33 and lateral layers to increase the quality of the direct bond, and to avoid any defects in surface topology that the epitaxy of the layer 33 could induce. It will be noted that, in this embodiment, unlike that of FIGS. 4A to 4F, the intermediate layer 23 is present in order to allow the doped lateral layers 35.1, 35.2 to be produced by epitaxial regrowth.

Figure 5A:
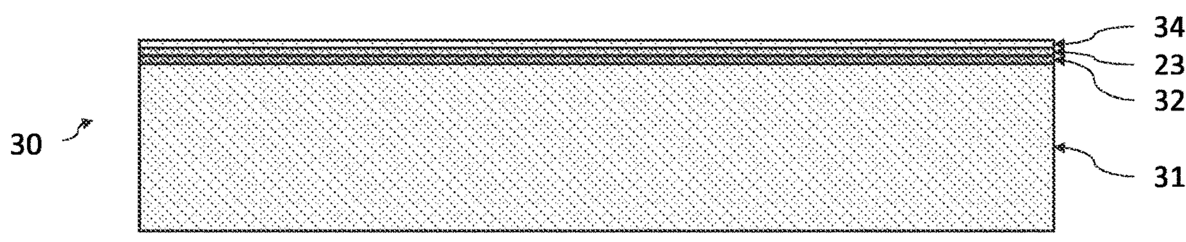
FIGS. 5A to 5F illustrate steps of a process for fabricating an optoelectronic device, according to another embodiment, in which the (active) central segment and the doped lateral layers are produced after transfer and joining to the photonic carrier substrate.

With reference to FIG. 5A, a semiconductor stack 30 is first produced, this stack comprising the growth substrate 31, which is here made of GaAs, the etch-stop layer 32, which is here made of InGaP, and the intermediate layer 23 made of $Al_yGa_{1-y}As$. Thus, the semiconductor stack 30 does not comprise the quantum-dot layer 33. The intermediate layer 23 is therefore produced by epitaxy from the etch-stop layer 32. A bonding layer 34 made of $SiO_2$ then covers the intermediate layer 23.

Figure 5B:
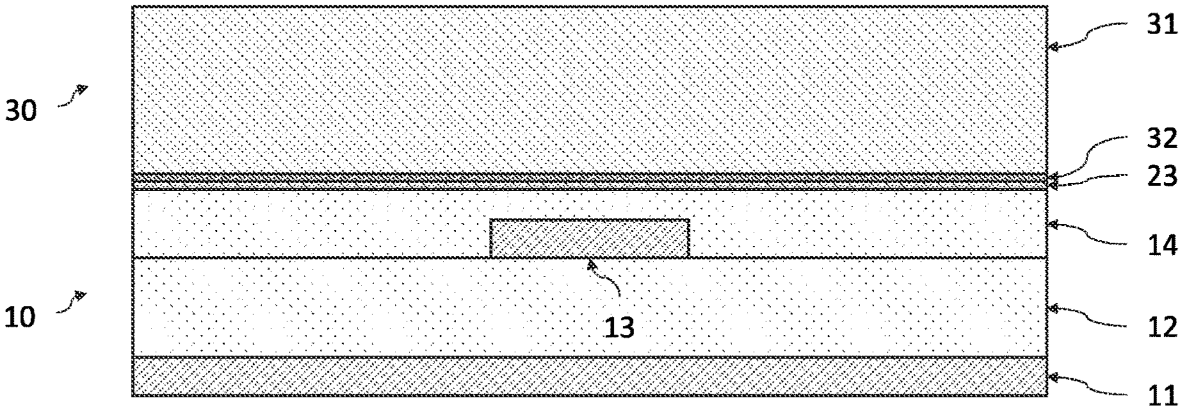

With reference to FIG. 5B, the semiconductor stack 30 is transferred and joined to the carrier substrate 10.

Figure 5C:
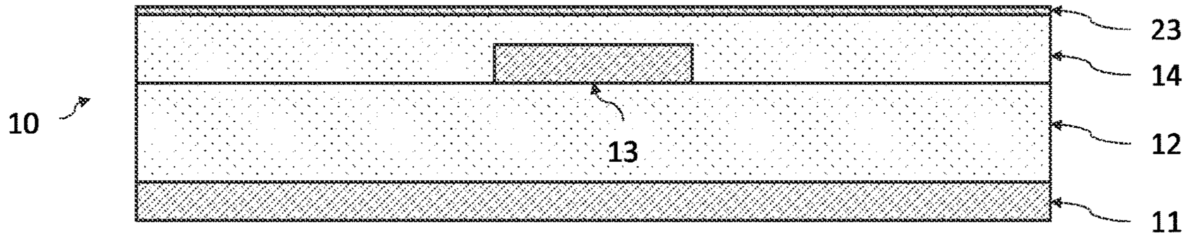

With reference to FIG. 5C, the growth substrate 31 is then removed, and the etch-stop layer 32 is removed. Thus, the intermediate layer 23 rests on the carrier substrate 10, and its top side is free.

Figure 5D:
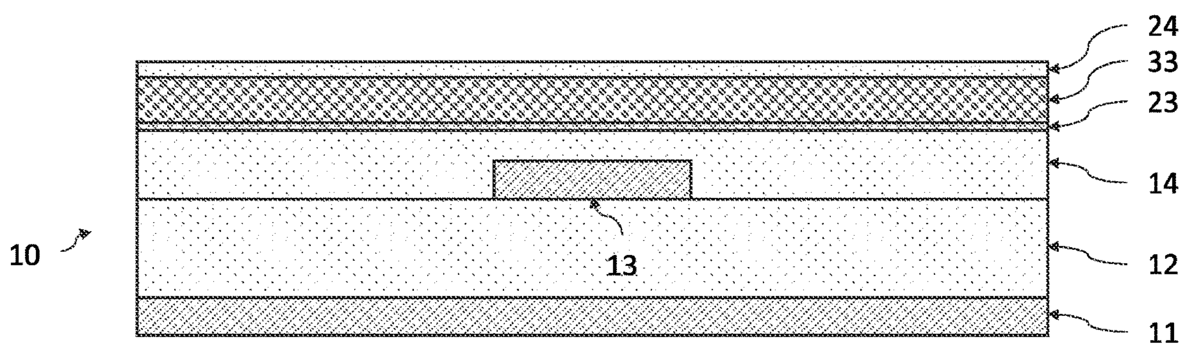

With reference to FIG. 5D, the quantum-dot layer 33 is produced by epitaxy from the intermediate layer 23. Here, unlike the embodiments described above, the quantum-dot layer 33 is produced after the step of transfer and direct bonding. In addition, it is produced by epitaxy from the intermediate layer 23 made of $Al_yGa_{1-y}As$ and not from the etch-stop layer made of InGaP.

Figure 5E:
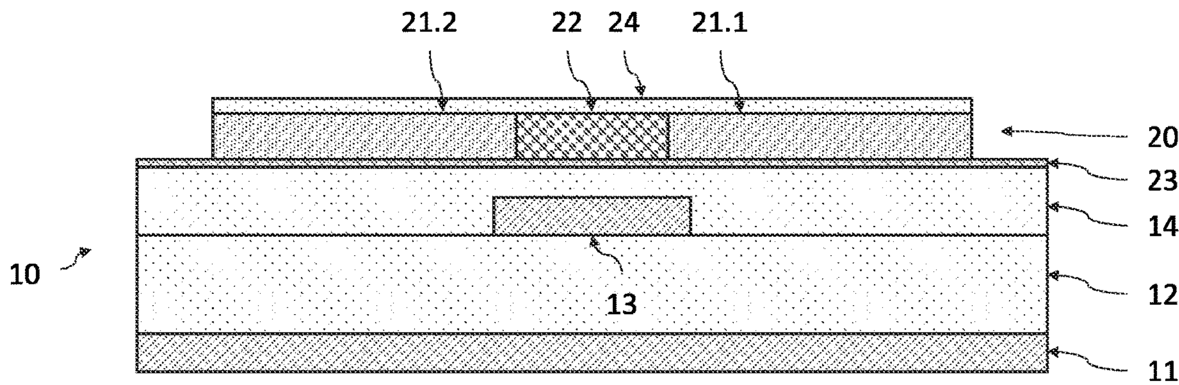
Figure 5F:
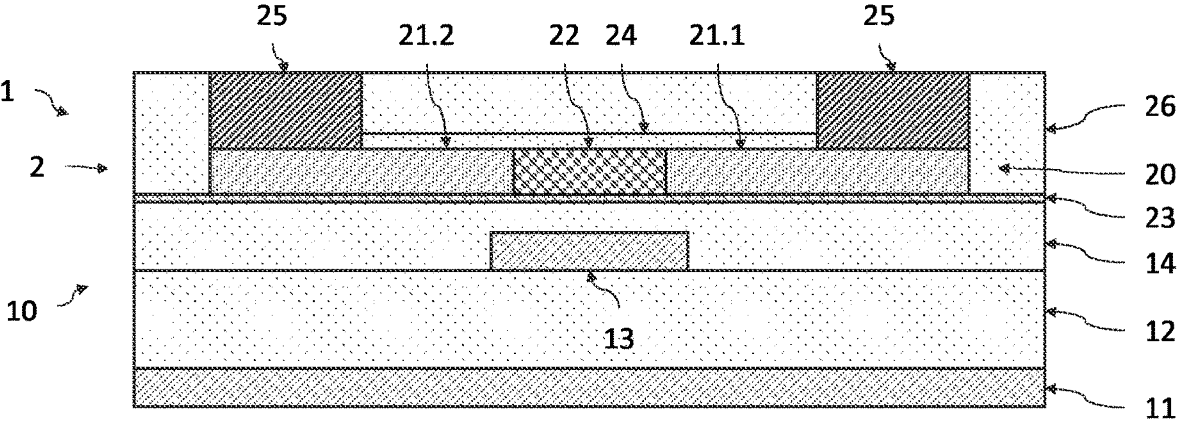

With reference to FIG. 5E and FIG. 5F, the semiconductor membrane 20 is then produced, in the same way as above, then the fabrication of the optoelectronic device is finished.

Particular embodiments have just been described. Various modifications and variants will be obvious to anyone skilled in the art.

The invention claimed is:

1. An optoelectronic device, comprising:

a carrier substrate, comprising:

a first dielectric layer, which is made of an electrically insulating material, and which forms a top side of the carrier substrate lying in a main plane;

a laser source, comprising:

a semiconductor membrane, which rests on the first dielectric layer, and which is formed from a lateral segment doped n-type, a lateral segment doped p-type, and an optically active central segment located between and in contact with the doped lateral segments to form a lateral p-i-n junction lying parallel to the main plane;

a second dielectric layer, which is made of an electrically insulating material, and which covers the semiconductor membrane;

electrodes, which rest on the doped lateral segments, and which thus ensure lateral injection of charge carriers into the central segment;

characterized in that wherein the semiconductor membrane is produced based on crystalline GaAs, the central segment comprising GaAs-based quantum dots, and the doped lateral segments being produced based on AlxGal-xAs with a proportion of aluminium x comprised between 0.05 and 0.30.

2. The optoelectronic device according to claim 1, wherein the proportion of aluminium x is comprised between 0.10 and 0.25.

3. The optoelectronic device according to claim 1, wherein the electrodes make contact with the doped lateral segments.

4. The optoelectronic device according to claim 1, comprising an intermediate layer, which is produced based on crystalline AlyGaAs with a proportion of aluminium y higher than the proportion of aluminium x of the doped lateral segments, and which lies between and makes contact with the first dielectric layer and the semiconductor membrane.

5. The optoelectronic device according to claim 1, wherein the first and second dielectric layers are made of a material having a refractive index lower than that of the central segment.

6. The optoelectronic device according to claim 1, wherein the carrier substrate is an SOI substrate.

7. The optoelectronic device according to claim 1, wherein the carrier substrate comprises an integrated waveguide optically coupled to an active waveguide formed by the central segment of the semiconductor membrane.

8. Process A process for fabricating an optoelectronic device according to claim 1, comprising:

a) producing a semiconductor stack, comprising: a growth substrate, an etch-stop layer grown epitaxially from the growth substrate, and an intermediate layer based on epitaxially grown AlGaAs;

b) transferring and joining the semiconductor stack to the carrier substrate, the intermediate layer being oriented toward the carrier substrate;

c) removing the growth substrate then the etch-stop layer;

d) producing the semiconductor membrane, from at least the intermediate layer;

e) producing the second dielectric layer and the electrodes.

9. The process according to claim 8, wherein:

in step a), the semiconductor stack comprises a quantum-dot layer, which is intended to form the central segment, which is grown epitaxially from the etch-stop layer, and from which the intermediate layer is grown epitaxially;

following step c), one side of the quantum-dot layer is freed;

step d) comprises operations of: structuring the quantum-dot layer to free a surface of the intermediate layer and to obtain the central segment; and producing the doped lateral segments by epitaxy from the intermediate layer.

10. The process according to claim 8, wherein:

in step a), the semiconductor stack comprises the intermediate layer grown epitaxially from the etch-stop layer;

following step c), one side of the intermediate layer is freed;

step d) comprises operations of: producing a quantum-dot layer by epitaxy from the intermediate layer; structuring the quantum-dot layer to free a surface of the intermediate layer and to obtain the central segment; and producing the doped lateral segments by epitaxy from the intermediate layer.

11. A process for fabricating the optoelectronic device according to claim 1, comprising:

producing a semiconductor stack, comprising: a growth substrate, an etch-stop layer grown epitaxially from the growth substrate, and a lateral structure grown epitaxially from the etch-stop layer and formed from the central segment and from doped lateral layers that are produced based on AlxGal-xAs and that are located on either side of the central segment in the main plane;

transferring and joining the semiconductor stack to the carrier substrate, an intermediate layer being oriented toward the carrier substrate;

removing the growth substrate then the etch-stop layer, freeing a side of the lateral structure opposite the carrier substrate;

producing the semiconductor membrane, by structuring the doped lateral layers to obtain the doped lateral segments; and producing the second dielectric layer and the electrodes.

* * * * *